United States Patent [19]
Mestha

[11] Patent Number: 5,298,867
[45] Date of Patent: Mar. 29, 1994

[54] PHASE-LOCKED LOOP WITH CONTROLLED PHASE SLIPPAGE

[75] Inventor: Lingappa K. Mestha, Cedar Hill, Tex.

[73] Assignee: Universities Research Association, Inc., Washington, D.C.

[21] Appl. No.: 807,144

[22] Filed: Dec. 13, 1991

[51] Int. Cl.$^5$ ............................................. H03K 7/00
[52] U.S. Cl. ..................... 328/233; 328/63; 328/72; 331/17
[58] Field of Search ............ 328/63, 72, 233, 235; 375/106, 110; 455/13.2, 259, 260, 265; 331/17; 371/25.1, 2.1

[56] References Cited

U.S. PATENT DOCUMENTS

| | | | |
|---|---|---|---|
| 3,147,396 | 9/1964 | Goerz et al. | 328/233 |
| 3,646,452 | 2/1972 | Horowitz et al. | 328/72 |
| 3,789,308 | 1/1974 | Lowdenslager | 328/63 |
| 3,983,498 | 9/1976 | Malek | 375/110 |
| 4,939,790 | 7/1990 | Sgrignoli | 455/260 |
| 4,972,160 | 11/1990 | Sylvain | 331/71 |
| 4,992,744 | 2/1991 | Fujita et al. | 328/233 |

OTHER PUBLICATIONS

Mestha, "Phase-Control Scheme for Synchronous Beam Transfer from the Low Energy Booster to the Medium Energy Boaster"; SSCL-340; Sep. 1991, pp. 1–38.

"Early Instrumentation Projects at the SSC"; D. J. Martin, et al.; SSCL; SSC Report; pp. 109–125; 1990.
L. K. Mestha; "A Controlled Master Frequency Oscillator for the SSC Low Energy Booster"; SSC Report; SSCL; American Institute of Physics; pp. 246–253; 1991.

Primary Examiner—Donald J. Yusko
Assistant Examiner—N. D. Patel
Attorney, Agent, or Firm—Richards, Medlock & Andrews

[57] ABSTRACT

A system for synchronizing a first subsystem controlled by a changing frequency sweeping from a first frequency to a second frequency, with a second subsystem operating at a steady state second frequency. Trip plan parameters are calculated in advance to determine the phase relationship between the frequencies of the first subsystem and second subsystem in order to obtain synchronism at the end of the frequency sweep of the first subsystem. During the time in which the frequency of the first subsystem is sweeping from the first frequency to the second frequency, the phase locked system compares the actual phase difference with the trip plan phase difference and incrementally changes the sweep frequency in a manner so that phase lock is achieved when the first subsystem reaches a frequency substantially identical to that of the second subsystem.

21 Claims, 10 Drawing Sheets

PHASE-LOCKED LOOP WITH CONTROLLED PHASE SLIPPAGE

This invention was made with Government support under Contract No. DE-AC35-89ER40486 between Universities Research Association, Inc. and the Department of Energy. The Government has certain rights in this invention.

TECHNICAL FIELD OF THE INVENTION

The present invention relates in general to apparatus and methods for synchronizing different electrical signals, and more particularly to instances where one signal is to be synchronized with another dynamically changing signal.

BACKGROUND OF THE INVENTION

There are many instances in which certain parameters, which may be dynamically changing with respect to each other, must be coordinated or synchronized at a particular point in time. Such situations may occur in both mechanical machines or electrical circuits. For example, two objects, such as airplanes, rockets or other moving objects may be desired to rendezvous at a certain point, where each object has a varying trajectory and/or velocity. In another example, electrical signals often require synchronization of one signal with another having a varying frequency.

In the mechanical example, the point and time of rendezvous can be calculated utilizing numerous algorithms and differential equations to define the end objectives. In the electrical example, fewer techniques are available for accomplishing the synchronization of the signals. Conventional phase-locked loops (PLL) are well adapted for creating an output frequency as a function of an input frequency. Such phase locked loops employ a phase detector, a low pass filter and a voltage controlled oscillator and a feedback loop. In this type of phase-locked loop, any difference between the input and output signals generates an error signal which is self correcting by the loop to maintain correspondence between the input and output. However, conventional phase-locked loops operate optimally when the input frequency does not vary substantially, thereby maintaining control over the error signal. If the input signal varies significantly in frequency or phase, the accumulation of errors become too great, whereupon the circuit is not able to maintain an established phase relationship.

The problems noted above are particularly pronounced in particle accelerators when transferring a particle bunch from one accelerator to the other. It is well known that particle bunches can be accelerated by utilizing magnetic fields and an RF signal which increases in frequency to achieve particle bunch acceleration. The problem exists in synchronizing the frequency of one accelerator to the other when transferring a particle bunch therebetween. In other words, a particle bunch circulating with others in a particular location in one accelerator is required to be transferred at a particular location in the next accelerator. Preferably, it is desired to operate the receiving accelerator at a steady state RF frequency during transfer, and sweep or modulate the frequency of the first accelerator from $f_1$ to $f_2$ to accomplish acceleration, and also to synchronize the frequencies of both accelerators together during particle bunch transfer. The synchronization problem is also exacerbated in that synchronization of the frequencies must occur during the maximum magnetic field within the first accelerator.

It is well known that two schemes are generally available for achieving synchronous transfer of bunched particle beams from one accelerator to the other namely, phase-locking and phase-slippage schemes. In the phase-locking scheme, at a known time before injection to the next accelerator, the phase and frequencies of the accelerating machine are locked to the extraction frequency. The time required to phase-lock the two frequencies depends on the lattice parameters of the accelerating machine. In the phase-slippage scheme, at a predetermined time before transfer, the frequency of the accelerating machine is offset a few cycles relative to the extraction frequency. The phase of the accelerating frequency slips relative to the fixed frequency, resulting in several phase coincidence points of the reference wave which occur at a beat frequency equal to the offset frequency. One of the coincident points is used to trigger the synchronous transfer of the beam.

From the foregoing, it can be seen that a need exists for a method and apparatus for obtaining and maintaining synchronization of parameters that vary with respect to each other. Another need exists for obtaining synchronization of a first frequency modulated signal with a second steady-state frequency signal, wherein the FM signal terminates with a frequency and phase equal to that of the steady-state frequency and phase.

SUMMARY OF THE INVENTION

In accordance with the present invention, the disclosed synchronizing methods and apparatus substantially reduce or eliminate the disadvantages and shortcomings associated with the prior art techniques. In accordance with an important feature of the invention, prestored trip-plan information is utilized in a closed loop circuit to continuously adjust an error signal to modulate one driving frequency so that when the sweep in frequency is complete, it is synchronized with another frequency.

In the preferred embodiment of the invention, two particle accelerators are synchronized to transfer accelerated particles from the first accelerator to a second accelerator. The first accelerator is driven by a frequency that sweeps from a lower frequency to a higher frequency, while the second accelerator operates at the second higher frequency. In an ideal case, the sweep frequency profile of the first accelerator is known, as well as the particle bunch speeds and path lengths of both accelerators, and thus the particle bunch locations can be determined with respect to each revolution of the second accelerator. Indeed, a particular particle bunch location of the first accelerator can be determined with respect to a particle bunch receptacle location or bucket in the second accelerator, all in advance of the actual acceleration and transfer of the particle to the receiving bucket. It can be seen that not only must the frequencies of the first and second accelerators be synchronized during particle bunch transfer, but the particular particle bunch in the first accelerator must also be aligned with the particle bucket of the second accelerator.

According to the invention, trip-plan data is calculated in advance such that for each cycle or turn, or fractions of a turn, or full and functional turn, of the second accelerator, the sweep frequency of the first accelerator is adjusted or modulated so that at transfer time, the accelerators are both synchronized and aligned with respect to the particular particle and receiving bucket. According to an important aspect of the invention, the actual phase difference between the accelerator frequencies is determined at predetermined times of the second accelerator. A sample is taken at each predetermined time. The actual phase difference is compared with the prestored trip-plan data for that sample, and an error signal is generated. The error signal is converted to the frequency shift of the first accelerator which is added to the sweep frequency to force the first accelerator to operate according to the trip plan. The error signal could also be converted to the shift phase and added to the phase shifter to shift the phase of the accelerating frequency. This procedure is repeated for each sample of the second accelerator so that at transfer time, when the particle bunch has been accelerated, the accelerators are both synchronized as to frequency and phase and the particle of the first accelerator is aligned with the desired receiving bucket of the second accelerator.

BRIEF DESCRIPTION OF THE DRAWINGS

Further features and advantages will become apparent from the following and more particular description of the preferred embodiment of the invention, as illustrated in the accompanying drawings in which like reference characters generally refer to the same parts, elements or functions throughout the views, and in which.

DETAILED DESCRIPTION OF THE INVENTION

Figure 1:
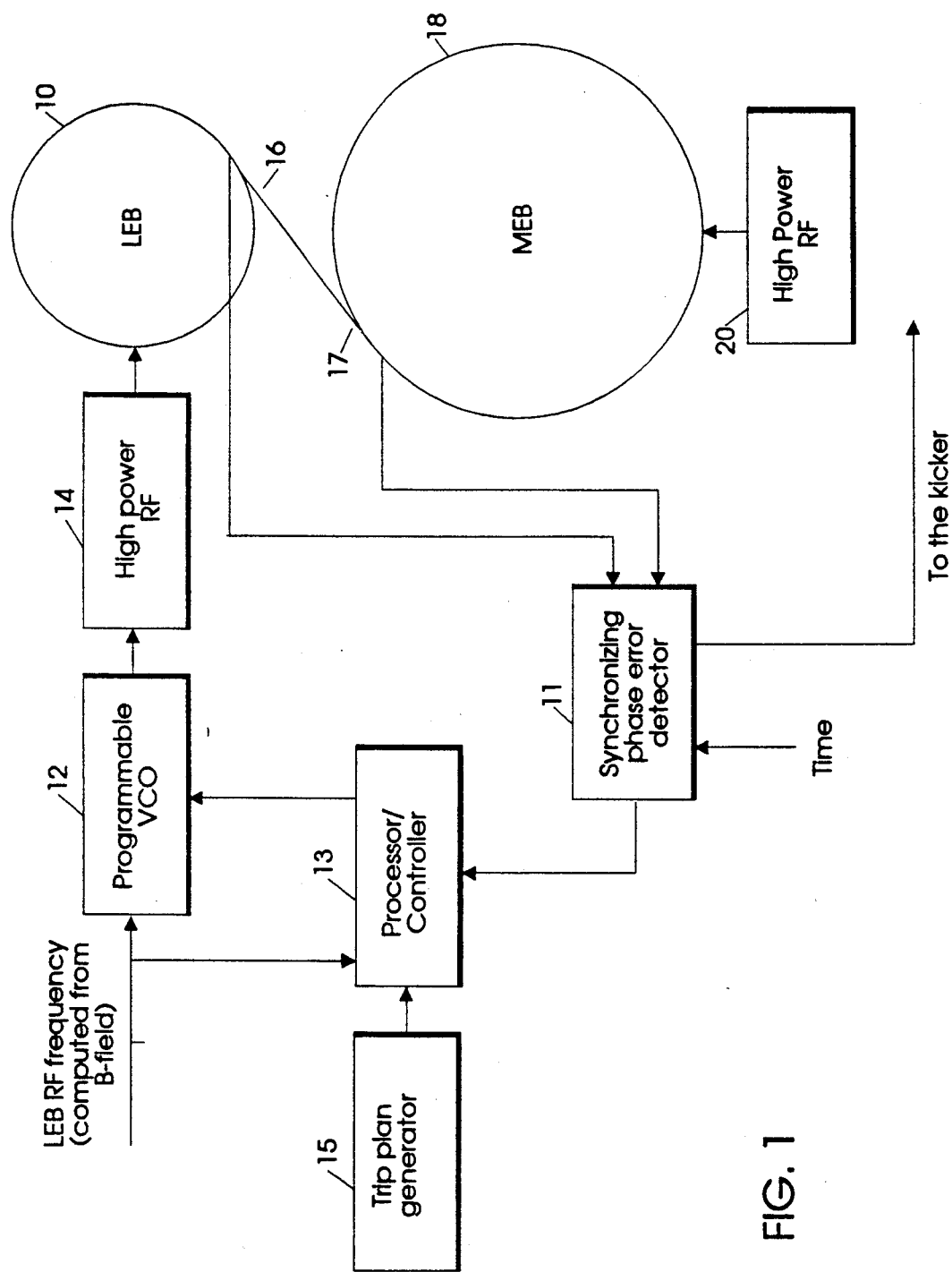
FIG. 1 illustrates a pair of particle accelerators coupled together, with corresponding control circuits shown in block diagram form, for accelerating particle bunches and transferring particle bunches from one accelerator to another.

FIG. 1 illustrates an environment in which the invention can be advantageously practiced, although those skilled in the art may find that the principles and concepts of the invention can be applied to many other applications, in both the mechanical and electrical fields. In the accelerator system shown in FIG. 1, a low energy booster (LEB) 10 is driven by a programmable voltage controlled oscillator 12 by way of a RF power amplifier 14. Preferably, the programmable oscillator 12 has a sweep frequency range between about 47.518 mHz and 59.776 mHz, and can be programmed to increase the frequency by an amount as low as about 1-2 Hz per increment. While not shown, a linear accelerator is coupled to an input of the LEB 10 for injecting focused particle bunches for circulation and acceleration in the LEB 10. The LEB 10 has a circumference of about 540 meters, and the particle bunches are spaced apart about five meters to accommodate about 108 bunches of spaced apart bunches. Two transfer "kickers" 16 and 17, when activated, transfer a selected particle bunch from the LEB 10 to a medium energy booster (MEB) 18. The MEB 18 is powered by a steady state RF power source 20 at a frequency of 59.776 mHz, the same as that of the high end frequency of the LEB 10. The MEB 18 has the circumference of 3960 meters, and is capable of holding 792 particle bunches, also spaced apart by five meters.

Figure 2:
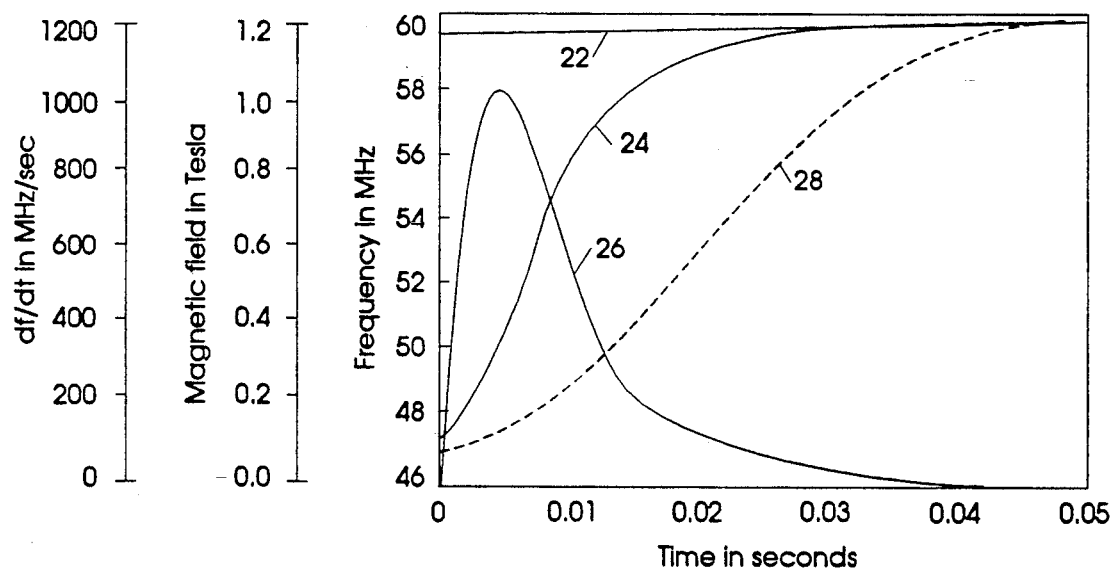
FIG. 2 graphically depicts the frequency characteristics of a low energy particle accelerator.

FIG. 2 graphically illustrates the frequency characteristics of signals of the MEB 18 and LEB 10. Particularly, the MEB frequency 22 is shown constant at 59.776 mHz. On the other hand, the LEB frequency 24 has a profile which changes from the low value of 47.518 mHz to a high value equal to that of the MEB, namely, 59.776 mHz. The rate of change of the LEB frequency 24 is shown as curve 26. The magnetic field 28 is related to the LEB frequency according to the following equation.

$$f = \frac{ch}{C\sqrt{1 + \left[\frac{(mc^2)/e}{pcB(t)}\right]^2}} \quad (1)$$

where
c = Speed of light
h = Harmonic number
C = Path length of the synchronous orbit
m = Mass of the particle
e = Charge on the particle
p = Effective bending radius
B = Magnetic field strength.

The horizontal axis of FIG. 2 illustrates time. The maximum magnetic field varies at a 10 hz rate, and reaches a maximum about 50 ms after a minimum. As can be appreciated, synchronization of the accelerating system involves changing the LEB frequency 24 according to the profile shown in FIG. 2 and not only synchronizing its upper frequency with that of the MEB 18, but also synchronizing the frequencies 22 and 24 in such a manner that a particular particle bunch can be transferred from the LEB 10 and placed in a particular circulating location (bucket) in the MEB 18. In addition, this action must be synchronized with the magnetic field 28 so that the transferred particle bunch maintains its accelerated velocity, and can be further accelerated in the MEB 18. While not shown, once the MEB 18 has been populated with a suitable number of particle bunches, such bunches can also be accelerated in a similar manner for transfer to yet other accelerators, not shown.

Referring again to FIG. 1, the accelerator system includes a synchronizing phase error detector 11 for detecting the actual phase error between the LEB 10 and the MEB 18 for each turn of the MEB. The actual phase error is coupled to a processor/controller 13 which compares the actual phase error with the pre-stored trip-plan data generated by a trip-plan generator 15. The processor/controller 13 then generates a corresponding error frequency for changing the LEB frequency to thereby drive the LEB 10 so that the resulting phase difference between the LEB and MEB frequency corresponds to an ideal phase difference. Phase slippage between the LEB 10 and the MEB 18 is thereby controlled to achieve synchronism and alignment.

Figure 3A:
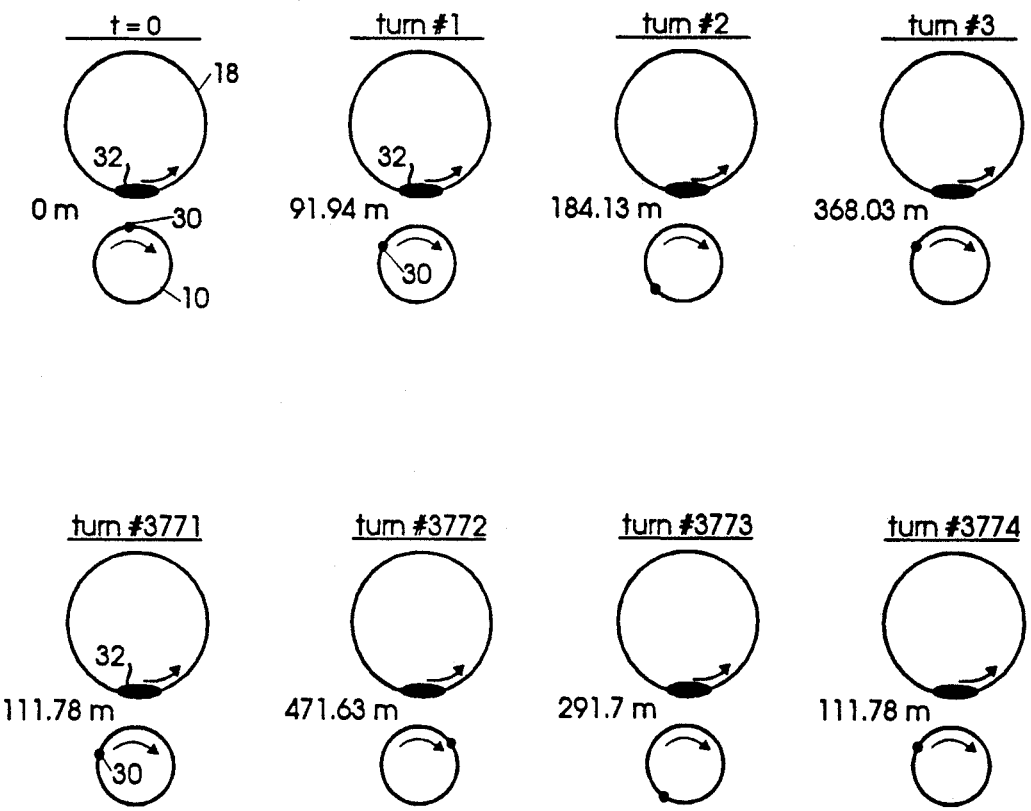
FIG. 3a diagrammatically illustrates the timing problems involved in transferring particle bunches from one accelerator to another, and particularly shows that the accelerators are synchronized as to frequency, but the particle bunch of one accelerator is not aligned with a receiving particle bucket of the other accelerator.
Figure 3B:
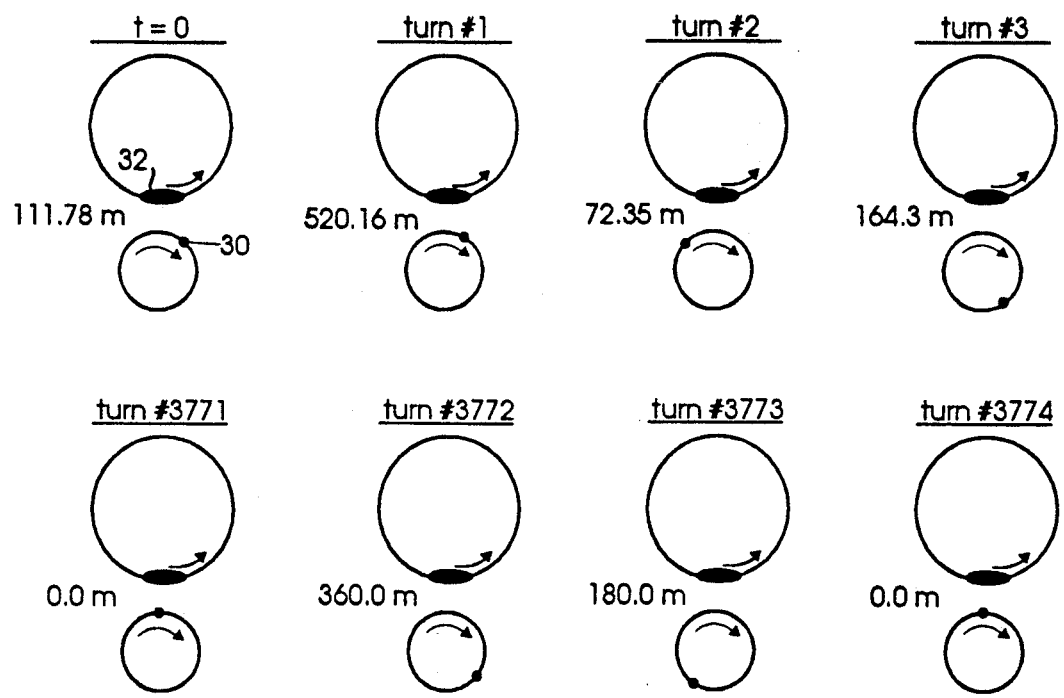
FIG. 3b illustrates synchronism and alignment of both particle accelerators.

The synchronization required in the accelerators 10 and 18 is illustrated in FIGS. 3a and 3b. In FIG. 3a, only a few cycles or turns of the MEB 18 are shown with respect to particle cycles in the LEB 10. For the following illustration, it should be noted that the circumference ratio of the MEB 18 with respect to the LEB 10 is 22/3. In other words, an LEB reference RF wave would complete several full turns and a partial turn when an MEB reference RF wave completes one full turn. If the two accelerator frequencies are the same, then the LEB reference RF wave completes seven full turns, and a partial turn equal to one third the LEB circumference. As noted above, with particle bunches spaced apart five meters in both the LEB 10 and MEB 18, there are 108 particle bunches in a fully populated LEB 10 and 792 particle bunches in a fully populated MEB is.

The fact that near synchronization of the respective RF waves in the LEB 10 and the MEB 18 is not enough is shown in FIG. 3a. Here, at t=0 and before acceleration occurs, a particle bunch 30 in the LEB is aligned with a particle bucket 32 in the MEB 18. After one full MEB turn, the MEB particle bucket 32 has returned to its starting point, while the LEB particle bunch 30 has made seven full turns and a partial turn, and is no longer aligned with the MEB particle bucket 32. As can be seen, after the second and third turns of the MEB particle bucket 32, the phase difference in meters between the MEB particle bucket 32 and the LEB particle bunch 30 remains different. At the bottom part of FIG. 3a, after acceleration has occurred, the last four cycles, or turns, of the MEB particle bucket 32 are shown. Significantly, in MEB turn 3771 and 3774, the LEB particle bunch 30 is synchronized with the MEB particle bucket 32, in that the phase difference remains at 111.78 meters in both instances. However, at these two turns, the respective particle bunch 30 and particle bucket 32 are not aligned.

The phase (in units of distance) of the LEB reference RF wave from a given time during acceleration is equal to:

$$\psi LEB = \frac{2\pi}{h} \int_0^\tau Rf(t)dt \tag{2}$$

where h is the number of particle bunches available in the LEB, i.e., 108, R is the radius of the LEB, f(t) is the frequency as a function of time, as shown by curve 24 in FIG. 2. $\tau$ is a time interval over which the integration is carried out. The phase (in units of distance) of the MEB reference RF wave is illustrated by the following equation:

$$\psi MEB = \frac{2\pi R'}{h'} f\tau \tag{3}$$

The difference in the foregoing equations is the synchronizing phase ($\psi$) which is:

$$\psi = |\psi MEB - \psi LEB| \tag{4}$$

Figure 4:
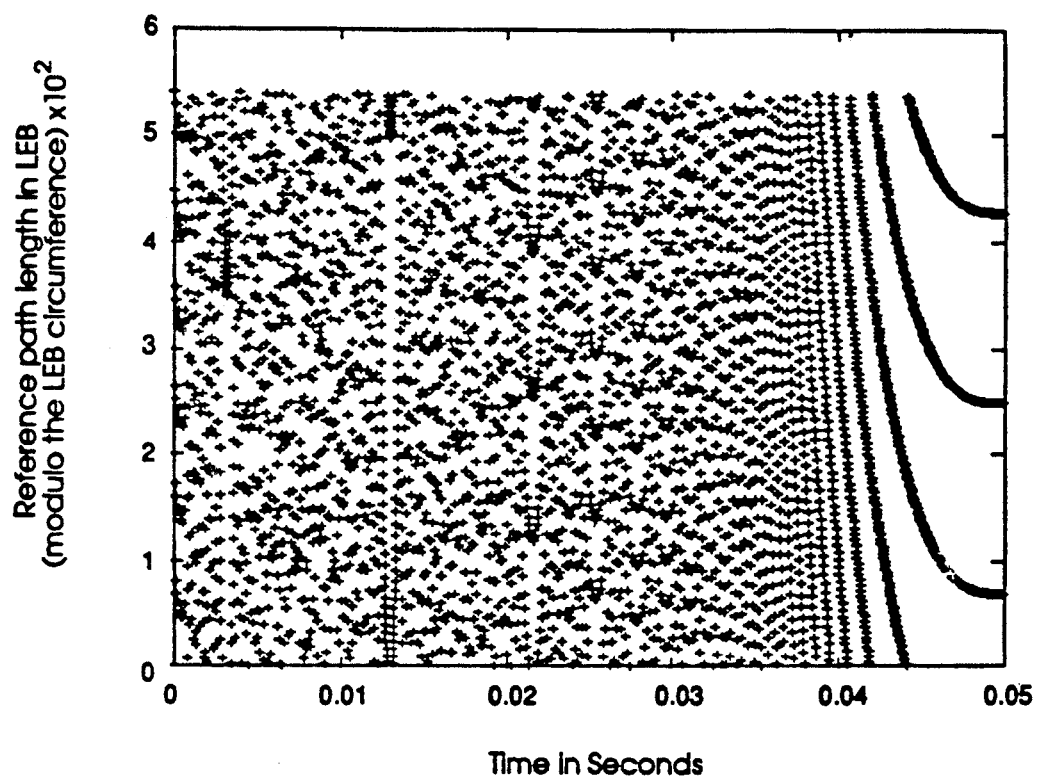
FIG. 4 graphically depicts the synchronizing phase during acceleration of a particle bunch in the first accelerator.

In order to achieve a synchronous transfer, the synchronizing phase must be equal to zero, ignoring the constant delay or transient time of particle bunches between the LEB 10 and MEB 18. The phase difference derived from equation 4 above is shown in FIG. 4 for each complete cycle of the MEB 18. The "+" symbols illustrate the position of the LEB reference RF wave for each MEB turn away from the transfer point. The phase values are shown from zero to 540 meters on the vertical axis to cover the full circumference of the LEB 10. The path length representing full turns completed by the LEB reference RF wave is ignored, since full LEB particle bunch turns are of no significance for synchronization. As can be seen from FIG. 4, about 50 ms after t=0, three curves approach constancy, i.e., the phase of the MEB 18 is synchronized with the phase of the LEB 10, although the particle bunches 30 and particle buckets 32 are not aligned. Three curves at the right hand portion of the graph appear due to the fraction "⅓" in the circumference ratio between the MEB 18 and the LEB 10. As noted in FIG. 4, the upper curve reaches constancy but the LEB particle bunch 30 is displaced from the MEB particle bucket 32 by 111.78 meters, as noted in turns 3771 and 3774 of FIG. 3a. The middle and lower curves reach constancy, but the LEB particle bunch 30 is displaced from the MEB particle bucket 32 by 291.7 meters and 471.63 meters, respectively. Accordingly, the synchronizing phase between the LEB 10 and the MEB 18 is not zero for transfer purposes. Rather, if an error or offset of 111.78 meters is initially incorporated, such as with a trip plan, in the synchronizing technique, then the LEB particle bunch 30 and the MEB particle bucket 32 can achieve synchronization as well as alignment, as shown in FIG. 3b. Referring to FIG. 3b, it is noted that a time t=0, the LEB particle bunch 30 is initially displayed 111.78 meters from the MEB particle bucket 32, and thus at turns 3771 and 3774 the MEB particle bucket 32 is synchronized and aligned with the LEB particle bunch 30. The combined synchronization and alignment of the respective particle bunches and particle buckets can be visualized in FIG. 4 if the three curves are displaced upwardly by 111.78 meters so that synchronization is achieved in the LEB at 540 meters, or multiples thereof. When displaced in the manner noted, one curve will intersect the vertical axis at zero meters.

The following mathematically describes the implementation of the synchronizing system of the invention. A system model can be obtained by introducing error terms for the beam orbit and the frequency defined above with respect to equation 2. Let $\delta R(t)$ be the deviation in radius of the orbit and $\delta f(t)$ be the error in the master frequency. The phase equation becomes:

$$\psi'(t) = \frac{2\pi}{h} \int (R + \delta R(t))(f(t) + \delta f(t))dt \tag{5}$$

The sign of $\delta R(t)$ depends upon which side of transition the accelerator system is operating. Since the control philosophy is to maintain a trip plan shown in FIG. 4 by modulating the LEB frequency as it is swept from a lower frequency to a higher frequency, an equation for the error in synchronizing phase in terms of the frequency is required. The phase error is equal to the offset in the path length covered by the LEB RF reference wave from the ideal path. Hence, a relationship is given by:

$$\delta\psi(t) = \psi'(t) - \psi LEB(t) \quad (6)$$

Substituting equations 2 and 5 into equation 6 and taking the first derivative with respect to time, the following differential equation is obtained.

$$\frac{d\delta\psi(t)}{dt} = \frac{2\pi}{h}(\delta R(t)f(t) + R\delta f(t) + \delta R(t)\delta f(t)) \quad (7)$$

In equation 7, in the absence of magnetic field error (i.e., $\delta B(t)=0$), $\delta R(t)$ can be related to frequency in the following manner:

$$\frac{\delta f(t)}{f(t)} = -\frac{\delta R(t)}{R}\left[1 - \frac{\gamma_T^2}{\gamma^2(t)}\right] \quad (8)$$

where $\gamma(t)$ is a function of frequency and $\gamma_T$ depends on the lattice parameters of the accelerator. Substituting for $\delta R(t)$ from equation 8 in equation 7, the following first order non-linear differential equation is obtained.

$$\frac{d\delta\psi(t)}{dt} = \frac{2\pi R}{h}\left[\frac{\gamma_T^2}{\gamma_T^2 - \gamma^2(t)}\right]\delta f(t) + \frac{2\pi R}{hf(t)}\left[\frac{\gamma^2}{\gamma_T^2 - \gamma^2(t)}\right]\delta f^2 t \quad (9)$$

Equation 9 indicates that the first term is time dependent due to the ramp in frequency of the LEB 10. The second-order terms are due to the errors in the radial position of the particle beam. If the phase error is known, then a feedback loop can be arranged to maintain $\delta\psi(t)$ near zero.

A scheme to calculate the phase error by measuring the LEB phase is described below. With this quantity known, it is clearly possible to define a feedback control loop which can modulate or change the LEB frequency to reduce the error. A feedback controller, such as a sliding-mode controller which accommodates the time-varying nature of the system can be utilized. Since the loop gain of such a synchronizing system is infinite, the system is not susceptible to parameter variation within the limits set by the constraints of the controller. A sliding line can be calculated using the measured phase error, which is equal to:

$$S(t) = \delta\psi(t) + c\int\delta\psi(t)dt \quad (10)$$

where c is the given value which is responsible for fixing the response time of the loop. A control function is obtained by monitoring the sign of the function S(t), given by $$u(t) = -(k_1|\delta\psi(t)| + k_o)\,\text{sgn}S(t) \quad (11)$$

where sgn S(t) is $+1$ when S(t) is positive and $-1$ when S(t) is negative, and $|\delta\psi(t)|$ is the absolute value of the phase error. It is to be noted that $k_0$ and $k_1$ are positive constants and should be set so as to make the loop stable. After this, the frequency shift ($\delta f(t)$), is calculated from the following equation:

$$\delta f(t) = \frac{h}{2\pi}u(t) - \left(\frac{h}{2\pi}\right)^2\frac{1}{f(t)}\left[\frac{\gamma(t)}{\gamma_T}\right]^2 u^2(t) \quad (12)$$

The coefficient of $u^2(t)$ is constant for a given MEB turn. The coefficients are preferably stored in a digital signal processor, to be discussed in more detail below, and recalled at each MEB turn or as many times as the corrections are required. The values of the constants c, $k_0$ and $k_1$ noted above are also stored in a digital signal processor. The control functions satisfy the global stability of the loop by satisfying the conditions set by the Lyapunov Stability Theory. For c=2,000, $k_1$=25 and $k_0$=0.5, the phase error becomes zero within about the first 10 milliseconds. Equation 9 above provides an indication of the system to be controlled. Using this system equation, the controller functions shown by equations 10, 11 and 12 can be obtained to correct for errors in the synchronizing phase. An accurate detection of the phase error is important to guarantee proper controller operation. The phase error can be detected for one or two MEB turns of particle buckets, depending upon the magnitude of the error. Waiting much longer than one MEB turn to measure the LEB phase could lead to significant error. The consequence will be greater frequency shift generated by the feedback controller, which may lead to particle beam oscillations. It is contemplated that the MEB completes about 3774 turns before it is ready to accept a particle bunch 30 from the LEB 10. If the phase is measured at every MEB turn, there will be 3774 points in the LEB cycle where the frequency shift or change has to take place. This is possible if the synchronizing circuits can extract the phase error from the measured LEB phase and then solve equations 10, 11 and 12 within the available time. One of the ways the LEB phase can be measured approximately is by time-tagging the arrival time of the LEB reference RF wave from the instant the MEB reference RF wave completes a turn. Preferably, a time-to-digital converter (TDC) is utilized to record the arrival time of the LEB reference RF wave. Using the time of flight information, the phase of the LEB reference RF wave is calculated in terms of the path length by using the following equation:

$$\psi'\text{ measured }(t) = 2\pi(R + \delta R(t))\frac{f(t) + \delta f(t)}{h}\tau' \quad (13)$$

where $\tau'$ is the arrival time of LEB reference RF wave, $\delta f(t)$ is the frequency shift of the LEB frequency in the previously MEB turn, and $\delta R(t)$ is the average radial position offset during the time-tagging period. Equation 13 assumes no frequency shift while measuring the arrival time of the LEB reference RF wave. The phase error is calculated by subtracting the measured LEB phase values from those shown in FIG. 4 for a given MEB turn. This can be accomplished in a digital signal processor in real time.

Figure 5:
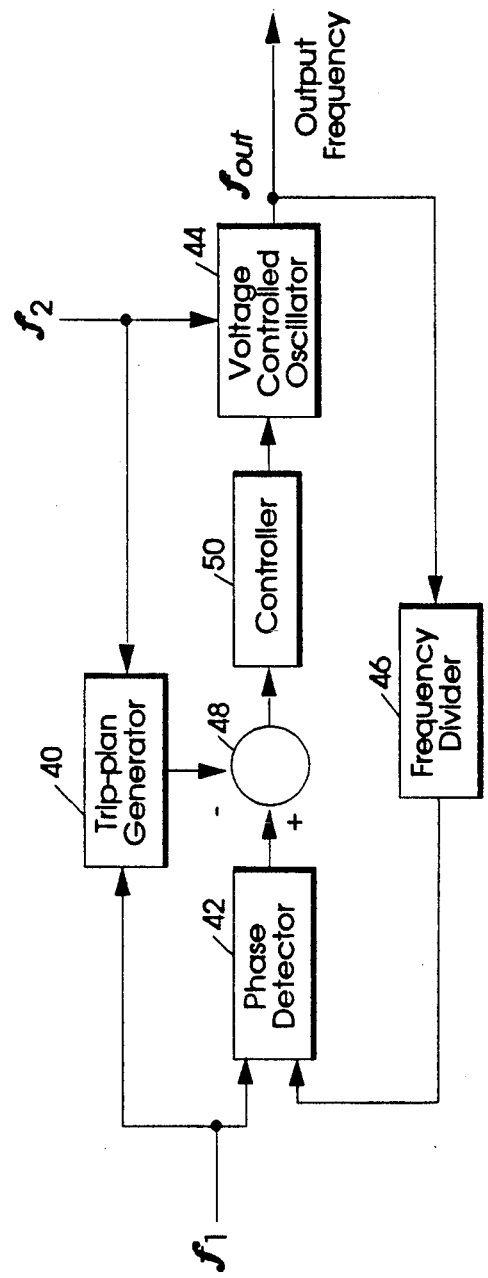
FIG. 5 is a generalized block diagram of a variable frequency phase-locked loop utilizing a trip-plan generator.

FIG. 5 illustrates a simplified variable frequency phase-locked loop employing a trip-plan generator according to the invention. In this embodiment, a stable frequency $f_1$ is input to a trip-plan generator 40 as well as to one input of a phase detector 42. A variable frequency $f_2$ is also input to the trip-plan generator 40, as well as to a voltage controlled oscillator 44. The output of the voltage controlled oscillator provides an output frequency $f_{out}$, as well as feedback to a frequency divider 46. The output of a frequency divider 46 is coupled to another input of the phase detector 42, an output of which is connected to a comparator 48. An output of the trip-plan generator 40 is connected to the comparator 48 and subtracted from the output of the phase detector 42. The output of the comparator 48 is connected to a controller 50, an output of which is coupled to the voltage controlled oscillator 44. The voltage controlled oscillator 44 can be a frequency synthesizer that provides an output AC frequency in response to a digital input. The voltage controlled oscillator 44 is driven by a voltage proportional to the variable frequency $f_2$. The output of the oscillator is locked onto a stable frequency source. The phase detector 42 measures the phase between the fixed frequency $f_1$ and the variable frequency $f_2$ at designated intervals of time. The phase is compared with the trip plan and an error signal is generated. As noted above, the trip-plan generator 40 has the input from the stable frequency $f_1$ and the input frequency $f_2$. The stability and loop performance is based on the type of feedback controller and/or filters and the number of phase samples taken. Since the voltage controlled oscillator 44 is locked to an external stable oscillator and a trip plan, the performance is significantly improved. The trip plan essentially constitutes values by which the LEB frequency must be changed so that the system which would otherwise operate without a trip plan, such as in FIG. 3a, operates in FIG. 3b to achieve synchronization and alignment of the respective LEB particle bunches 30 with MEB particle buckets 32. It should be understood that the stable oscillator frequency $f_1$ is not essential to the operation of the circuit. Under such circumstances, the phase values can be obtained at a fixed/variable time from the phase detector to compare the ideal values at such points. The sampling and timing clocks can be generated externally, and are not shown in the block diagram.

Figure 6:
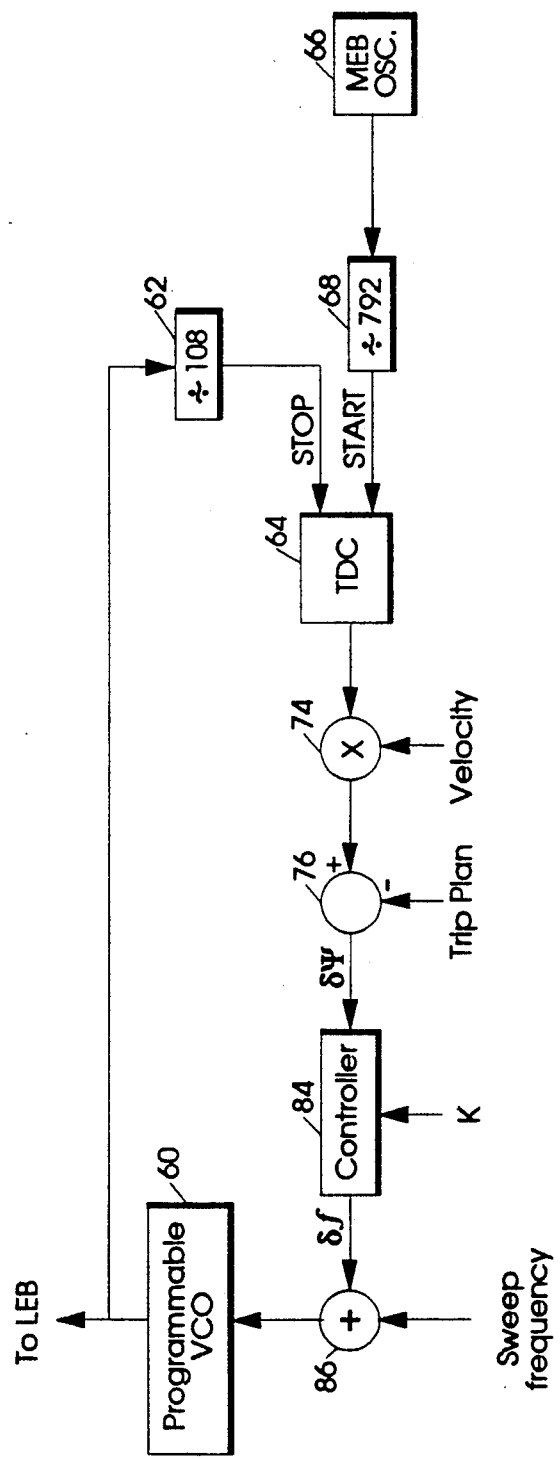
FIG. 6 schematically illustrates frequency synchronization circuits according to the invention.

FIG. 5 illustrates a variable frequency phase-lock loop in which many of the control elements can be either digital or analog in nature. Here, the method and apparatus is described to phase lock two frequency sources that could be separated by any frequency. The two frequencies are phase locked to a pre-programmed "trip-plan" calculated from two frequency sources at given points in time, depending upon the samples required throughout the locking period. If $f_1$, $\psi_1$ and $f_2$, $\psi_2$ are the frequency and phase (in radians) of sources one and two, respectively, then they are related by the well-known equations below:

$$\psi_1(t) = 2\pi \int_0^T f_1(t)dt \qquad (14)$$

$$\psi_2(t) = 2\pi \int_0^T f_2(t)dt$$

where $\tau$ is the time interval over which the integration is carried out. The difference between equations 14 is defined herein as the trip plan. According to the invention, the circuit configuration of FIG. 6 is utilized in conjunction with the accelerators described above. The trip plan of FIG. 4 is shown for the MEB frequency of 59.776 mHz and the LEB frequency sweeping from 47.518 to 59.776 mHz in a 50 millisecond period, and with a frequency modulation as shown in FIG. 2 as line 24. The phase constitutes a modulo of 360°. The phase values are shown at every 792 cycles of the MEB 18 and every 108 cycles of the sweeping frequency of the LEB 10. As noted above, it is seen that in the last few milliseconds of the 50 millisecond sweep period, the LEB and MEB phase values reach constancy. Also as noted above, the three constant phase values shown in FIG. 4 as they approached the 50 millisecond period is due to the fraction "⅓" in the ratio of 792/108. Of course, the pattern will be different with different combinations of such ratios. For example, if the MEB 18 is operating at a fixed frequency, and the LEB frequency is varying in a linear manner, then the trip plan would be a parabola with a rollover of the phase when the modulo of 360° is considered.

If the oscillator with the output frequency $f_2$ represents an ideal source, the variation in phase between the two frequency sources is given by the following equation:

$$\frac{d\delta\psi_1(t)}{dt} = 2\pi\delta f_1(t) \qquad (15)$$

where $\delta\psi_1(t)$ is the deviation in phase of the oscillator and the output frequency $f_1$ due to the deviation in frequency by the amount equal to $\delta f_1(t)$. The trip plan can be measured using a phase detector or equivalent hardware and then compared with the ideal or reference values of FIG. 4, such as 111.78 meters, etc., obtained from a look-up table. Thus, the resulting phase error is shown in the equation below.

$$\delta\psi_1 = \psi_{1-measured} - \psi_{1-ideal} \qquad (16)$$

When the absolute value of the phase error is greater than 180 degrees it is necessary to take the following precaution when determining the difference between the measured trip-plan and the ideal trip-plan.

When $\delta\psi_1 \geq 180°$ use $\delta\psi_1 = -360 + \psi_{1-measured} - \psi_{1-ideal}$ and when $-\delta\psi_1 \geq 180°$ use $\delta\psi_1 = 360 + \delta\psi_{1-measured} - \psi_{1-ideal}$ This applies to instances where the phase error is measured in degrees having a modulo of, for example 360°. If the phase error is measured in units of distance, or any other units, then an appropriate modulo would have to be considered in connection with the foregoing equations. In the accelerator controller of FIG. 5, the phase correction resulting from the foregoing equations is carried in a digital manner. This is then converted to a frequency by passing through a controller and then fed back to the variable oscillator. The feedback controller can be as simple as a proportional controller or as sophisticated as a sliding-mode controller, or other nonlinear robust or adaptive feedback controllers such as shown in the technical papers: D.J. Martin, et al.: "Early Instrumentation Projects at the SSC", International Industrial Symposium on the Super Collider (IISSC), Miami (USA), March 14-16, 1990; L.K. Mestha, et al.: "Synchronization of a Variable Frequency Source with a Fixed Frequency Source Using a Sliding-Mode Controller", IEEE Particle Accelerator Conference, San Francisco, Calif., 6-9 May 1991; and L.K. Mestha: "Phase-Control Scheme for Synchronous Beam Transfer from the Low Energy Booster to the Medium Energy Booster", SSC Report, SSCL-340, 1991, the disclosures of which are incorporated herein by reference. By utilizing nonlinear time or frequency domain controllers, the oscillators can be phase locked even when one oscillator is changing in frequency abruptly, due to some type of disturbance. If $\delta f_1$ is the output of the controller, it is obtained by the following equation:

$$\delta f_1 = -\left(\frac{k_1}{2\pi}|\delta \psi_1| + k_0\right)sgnS \tag{17}$$

where $$S = \delta\psi_1 + k_1\int \delta\psi_1 dt \tag{18}$$

and sgnS is $+1$ when S is greater than zero and sgnS is $-1$ when S is less than zero. The constants $k_1$ and $k_0$ are selected to achieve the required loop time constant and reject the disturbance and uncertainties in the loop. It can be appreciated that the nonlinear controller of the type shown above will facilitate phase locking the oscillators accurately during the presence of uncertainties due to measurement error or variation in the VCO parameters themselves. The switching function sgnS can be replaced by well known saturation functions to reduce noise.

Figure 7:
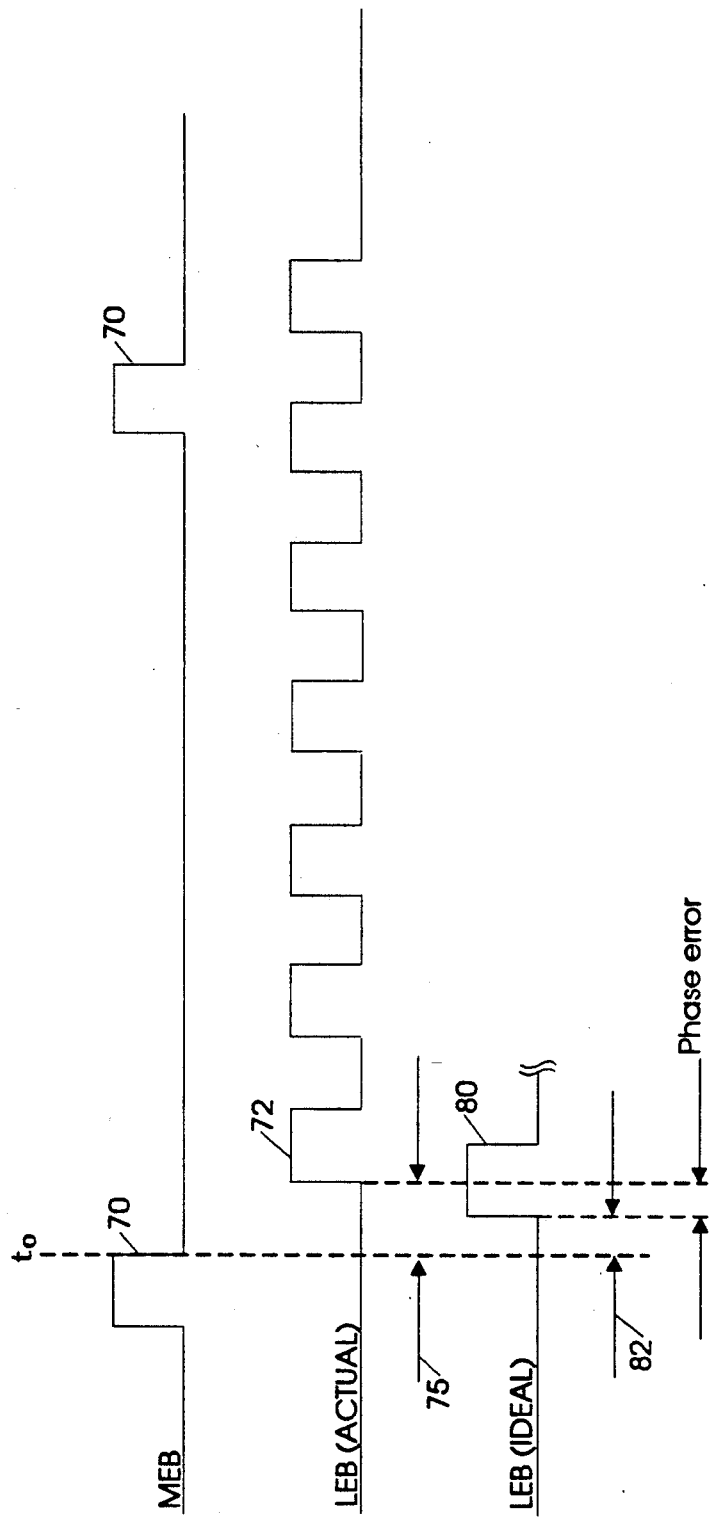
FIG. 7 depicts a number of electrical waveforms showing the actual and ideal phase differences generated by the loop of FIG. 6.

In the embodiment of FIG. 6, a programmable VCO 60, which can be a digital frequency synthesizer, provides an output frequency coupled to a divider 62 that divides the VCO frequency by 108. The output of the divider 62 is coupled to a stop input of a time-to-digital converter (TDC) 64. The TDC 64 can also be a conventional time interval counter. A fixed frequency, such as the MEB RF oscillator 66 provides an output to a divider 68 that divides the MEB frequency by 792. As can be appreciated, the divider 62 divides an input frequency by a number that is equivalent to the number of cycles per revolution and is thus equal to the revolution frequency of the particle bunches in the LEB 10. In like manner, the divider 68 divides by a number that is equivalent to the RF cycles per turn in the MEB 18, the resulting frequency is also equal to the revolution frequency of the particle bunches or particle buckets that circulate in the MEB. The output of the divider 68 thus provides an output pulse for every complete cycle of the MEB 18. The waveform output by divider 68 is shown in FIG. 7 as pulses 70. The output of the divider 68 is provided to a start input of the TDC 64. The output of the TDC 64 is coupled to a multiplier 74. The pulses 70 shown in FIG. 7 occur every 13.249 microseconds in correspondence with the steady state MEB frequency of 59.776 mHz. In like manner, the output of counter 62 provides a pulse output for every complete LEB turn of a particle bunch, such as shown by pulses 72 in FIG. 7. While not shown, the LEB pulses 72 provided by the output of counter 62 have a shorter period than those of the MEB 18, since the LEB has a significantly smaller circumference. Also, while not shown, the LEB pulses 72 decrease in period during the frequency sweep from 47.518 mHz to 59.776 mHz. Of course, the counters 62 and 68 are reset at a predetermined reference point, such as at the beginning of a specific MEB cycle. It is noted that about seven LEB pulses 72 correspond to one MEB pulse 70, thereby illustrating that the circumference of the MEB 18 is about seven times that of the LEB 10, and where the particle bunches are about five meters apart in each such energy booster.

The output of the TDC 64 illustrates the phase 75, such as shown in FIG. 7. The output of the TDC 64 is a parameter having units of "time." The other input to the multiplier 74 is a velocity parameter of the particle bunch 30 at the time $t=0$ shown in FIG. 7. The velocity parameter, which can be a digital number, can be prestored in a memory and recalled to define the velocity of the particle bunches at each reference cycle of the LEB. The velocity parameters supplied during each MEB cycle to the multiplier 74 can be precalculated using the relationship $V=2\pi Rf/h$. Of course, if the measured parameters from the system to be synchronized are distance or phase, then the multiplier 74 is not required.

Once the time and velocity parameters are multiplied by the multiplier 74, an output is provided to a difference circuit 76. Particularly, the output of the multiplier 74 is provided to a noninverting, or addition input of the difference circuit 76, while a trip-plan parameter is provided to an inverting, or subtraction input of the circuit 76. It should be noted that the trip-plan parameters provided to the difference circuit 76 can also be prestored in advance, but depending upon the speed of the system, may be generated on the fly. As noted above, the trip plan parameters can be predetermined based upon the profile of the frequency sweep of the LEB 1 and the frequency of the MEB 18 so that for every MEB cycle, it is known in advance what an ideal phase 82 (FIG. 7) must be in order for synchronism and alignment to occur thereafter. Also as noted above, while synchronism between the LEB 10 and MEB 18 will eventually occur, in that both system then operate at the same end frequency (59.776 mHz), an initial offset will generally need to be determined in order for there to be exact alignment of the LEB and MEB particle bunches 30 and particle buckets 32 shown in FIG. 3b. Thus, an ideal phase displacement between the MEB pulses 70 and LEB pulses 80 (FIG. 7) can be calculated to produce the ideal phase 82 so that synchronism and alignment of the particle bunches can be assured. The difference $\delta\psi$ between actual phase 75 and the ideal phase 82 is generated by the difference circuits 76 and provided to a controller 84. In the example, the parameter output by the difference circuit 76 comprises a "distance" parameter that is converted to a corresponding frequency ($\delta f$) parameter by the controller 84. The $\delta f$ parameter represents a change in frequency. The controller 84 can convert the $\delta\psi$ parameter to a $\delta f$ parameter in a linear or nonlinear manner. As noted above, the controller 84 can be a feedback controller with any simple gain function for multiplying the $\delta\psi$ parameter with a desired constant k. In the preferred embodiment, the controller 84 converts $\delta\psi$ to $\delta f$ in a linear relationship. Importantly, the controller 84 provides a $\delta\psi$ to $\delta f$ conversion in a manner so as to reduce the $\delta\psi$ error. In other words, at the end of the trip plan, the actual phase 75 and the ideal phase 82 shown in FIG. 7 are identical, thereby assuring synchronism and alignment.

The output of the controller 84 is coupled to an LEB 10 is coupled to the adder circuit 86 and combined or modulated with $\delta f$ to provide an output for controlling the programmable VCO 60. The inputs to the adder circuit 86 can be analog signals, in which event the programmable VCO 60 would be controlled with an analog input to produce a corresponding output frequency. On the other hand, the inputs to the adder circuit 86 can be digital, in which event the programmable VCO 60 would be a digital frequency synthesizer.

Figure 8:
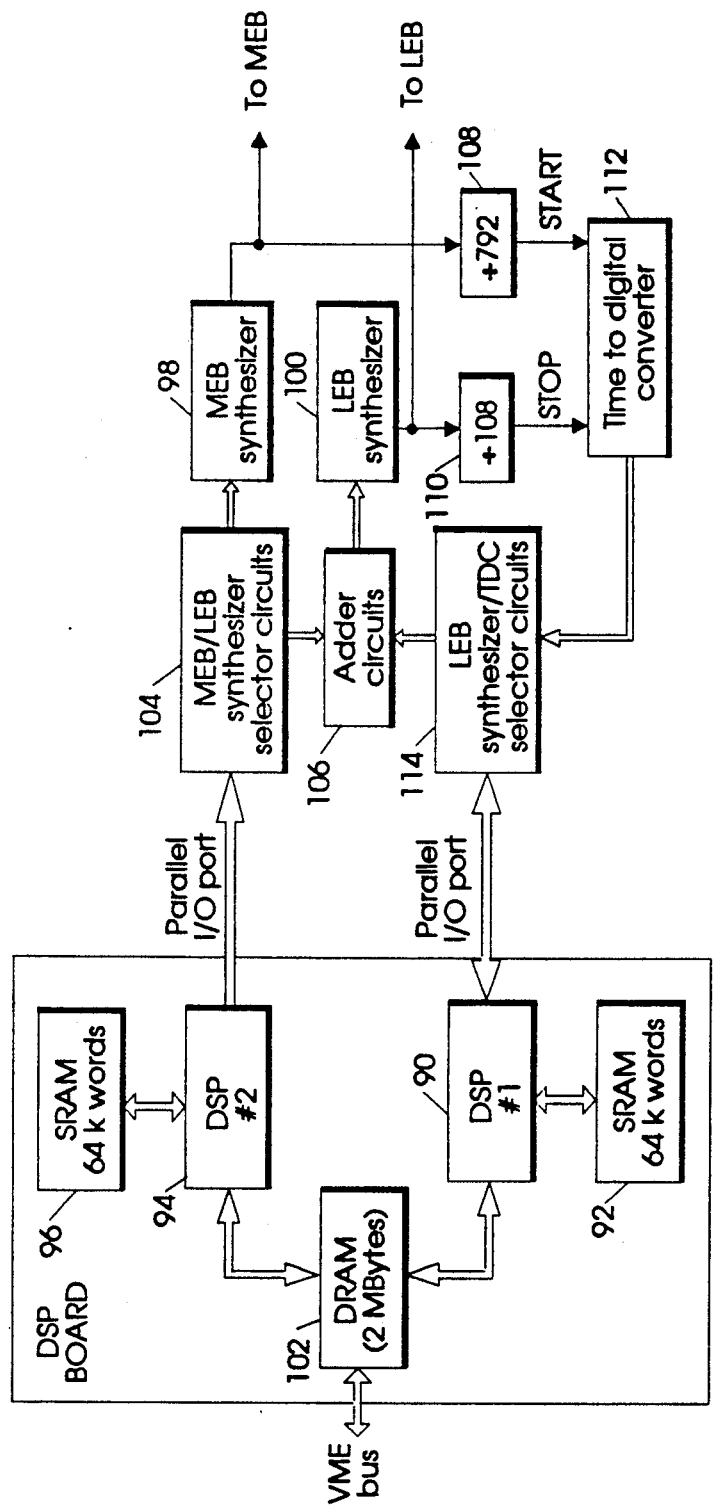
FIG. 8 illustrates a digital implementation of the synchronizing technique of the invention.

According to a preferred implementation of the invention, there is shown in FIG. 8 a technique for providing a controlled phase slippage to synchronize and align particle bunches and particle buckets between the two accelerators. In the preferred form of the invention, MEB and LEB frequency synthesizers are controlled in a digital manner by digital signal processors and corresponding memories that store programs and the various parameters. A first digital signal processor (DSP) 90 operates in conjunction with a static random access memory 92 to provide $\delta f$ parameters for modulating the LEB frequency appropriately so as to provide the desired synchronization and alignment of the LEB particle bunches 30 with the MEB particle buckets 32. Essentially, the multiplier 74, the difference circuit 76 and the controller 84 shown in FIG. 7 are incorporated as functions in the first DSP 90. In this manner, the DSP 90 can perform all functions in real time so as to change the LEB frequency appropriately to achieve synchronism. In order to accomplish this, the trip plan parameters and the particle velocity parameters are stored in the memory 92. The second digital signal processor 94 also operates in conjunction with a memory 96 to provide digital words for controlling both the MEB frequency synthesizer 98 and the LEB frequency synthesizer 100.

In order to provide real time changes in the LEB frequency, the first DSP 90 operates at about 75 kHz clock rate, while the second DSP 94 operates at about 1 MHz rate. Preferably, both digital signal processors are of the type TMS320C30, obtainable from Texas Instruments Incorporated. The DSP 94 is programmed to operate in a manner to provide changes in the LEB frequency about every microsecond. In this manner, the LEB frequency changes are not significant over the entire spectrum, thus minimizing error in the system. Also not shown for purposes of clarity are timing circuits for controlling the other circuits shown in FIG. 8. Memories 96, 102 and 92 store the software program and data for controlling the timing and operation of each of the digital signal processors 90 and 94. A central computer (not shown) of the accelerator complex can download the software into relevant memories for controlling the digital signal processors 90 and 94.

An MEB/LEB selector circuit 104 allows the second DSP 94 to provide digital words either to the MEB frequency synthesizer 98 or to an adder circuit 106. The second DSP 94 is programmed to provide a single digital word to the MEB frequency synthesizer 98 for producing the 59.776 mHz frequency. On the other hand, the selector 104 can be switched to provide digital words to the adder circuit 106 for causing the LEB frequency synthesizer 100 to traverse a sweep frequency from 47.518 mHz to 59.776 mHz. The digital signal processors 90 and 94 are both responsive to a start signal (not shown) to commence the respective generation and sweeping of each of the noted frequencies during an acceleration cycle commenced by the central computer.

During the generation of the sweep frequencies as controlled by the second DSP 94, the first DSP 90 also causes the sweep frequency to be changed or adjusted in correspondence with a trip plan stored in memory 92. The second DSP 94 stores in the memory 96 the frequency profile 24 shown in FIG. 2. The output of the MEB frequency synthesizer 98 is divided by a divider 108, and the output of the LEB frequency synthesizer 100 is divided by a divider 110, as noted above in connection with FIG. 7. A time-to-digital converter (TDC) 112 determines the actual phase 75 during each MEB cycle and provides the same to a selector circuit 114. The TDC 112 is of conventional design, and can be a time interval counter. The first DSP 90 controls the selector circuit 114 so that the actual phase 75 is coupled from the TDC 112 to the first DSP 90 for multiplying by a corresponding velocity parameter. The phase delay resulting from the multiplication process is subtracted from a prestored and associated trip plan parameter to provide a correction signal ($\delta\psi$). The $\delta\psi$ parameter is then converted to a {corresponding $\delta f$ parameter, representing the amount by which the LEB frequency must be changed from the prestored profile generated by the second DSP 94. The conversion of $\delta\psi$ to $\delta f$ can be carried out by way of a look-up table in the memory 92 that cross references various $\delta\psi$ parameters to corresponding $\delta f$ parameters. In the alternative, a mathematical algorithm can be employed. Once the foregoing calculations and conversions have been carried out by the first DSP 90, the selector circuit 114 is then switched so that the resulting $\delta f$ parameter can be coupled from the first DSP 90 to the adder circuit 106. In the adder circuit 106, the $\delta f$ parameter is added to the digital word corresponding to the LEB frequency generated according to the profile 24 by the second DSP 94. The adder circuit 106 then provides the resultant digital word to the LEB frequency synthesizer 100 for producing a corresponding output frequency. The feedback loop shown in FIG. 8 must execute the following functions within one MEB turn, which is about 13.249 microseconds in duration:

a) "actual phase difference" measurement using the TDC 112, b) handshaking between the TDC 112 and the first DSP 90 for data acquisition, c) LEB phase from equation 13 d) phase error by subtracting the results of c) above from the trip plan, and correction required to account for the phase wraparound, e) frequency shift $\delta f$ by solving equations 10, 11 and 12, and f) addition of the frequency shift $\delta f$ with the master LEB frequency.

From the foregoing, disclosed is a phase locked loop with a controlled phase slippage that assures synchronism according to a precalculated trip plan. With the foregoing description, those skilled in the art may readily adapt the principles and concepts of the invention to other systems to control two or more varying system parameters to achieve synchronism by utilizing two or more trip plans.

Figure 9:
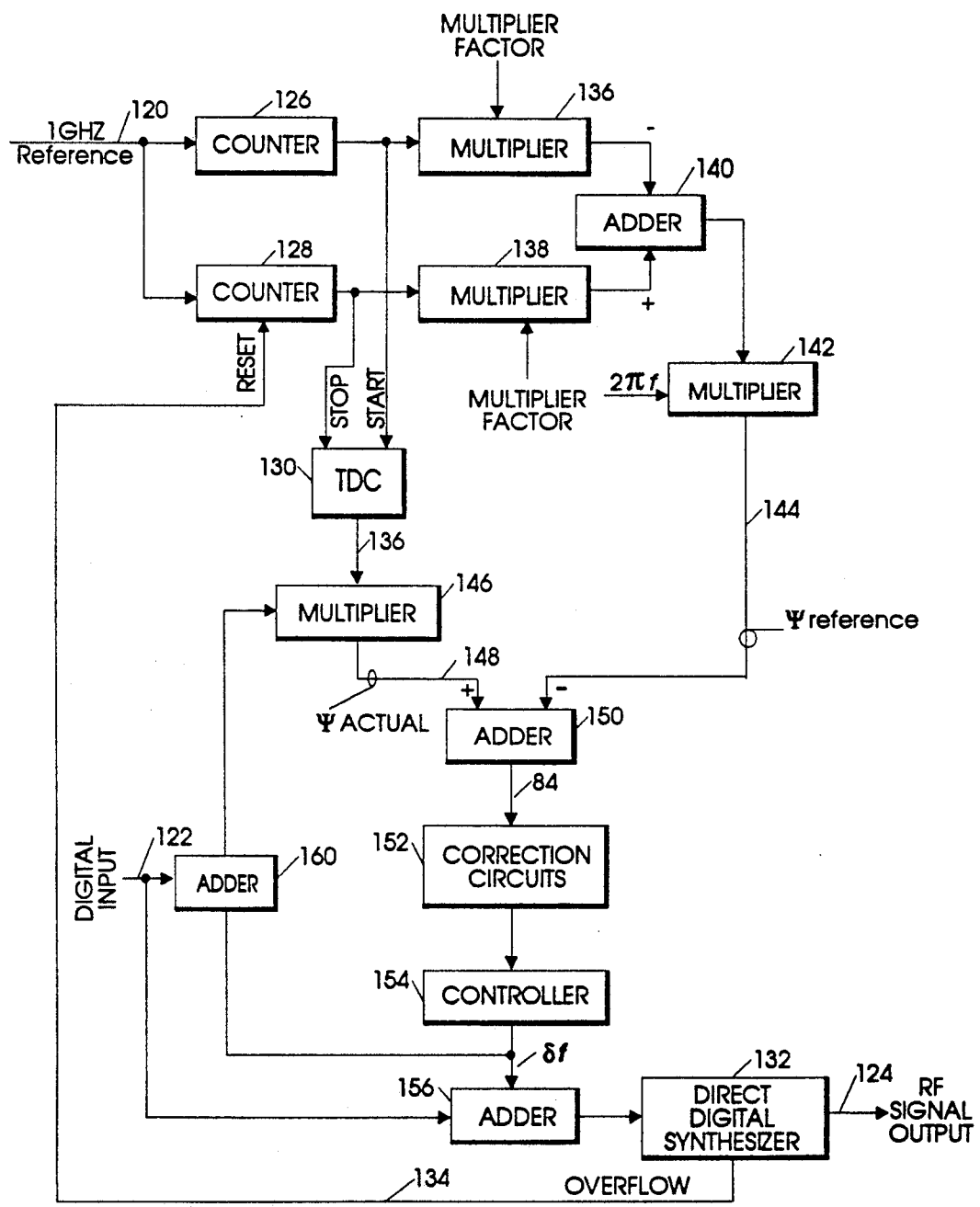
FIG. 9 illustrates another implementation of the invention utilizing a direct digital synthesizer.

FIG. 9 illustrates a phase-locked loop employing a direct digital synthesizer. According to this technique, a trip plan is generated on the fly without the need of digital signal processors or corresponding memories for processing or storing the trip plan data. Particularly, a precision signal generator is disclosed in which a sinusoidal output is generated as a function of a digital input, where the output is believed to exhibit a very low jitter, due to the use of the trip plan feature according to the invention.

In the signal generator shown in FIG. 9, a high frequency signal, such as a 1 gHz, low jitter reference signal is provided at an input 120 of the signal generator. A digital signal is also provided to an input 122 corresponding to the frequency of the RF signal desired at an output 124. For example, a digital word identifying 50 mHz is provided at input 122 for allowing the signal generator to provide a corresponding 50 mHz sinusoidal waveform on output 124. It is believed by utilizing the trip plan feature of the invention, the RF signal on the output 124 has significantly reduced jitter as compared to that of the high frequency signal provided at the reference input 120.

The signal generator operates in the following manner. The reference signal at input 120 is coupled to a pair of counters 126 and 128. In the example, counter 126 is a divide by 10. The output of counter 126 is connected to the start input of a time-to-digital converter 130 to start the measurement of time. If, for example, the reference input is 1 gHz, a pulse train of 1 nanosecond (NS) pulses will be counted down by counter 126, whereupon such counter will provide an output every 10 nanoseconds, but the output for every 20 nanoseconds is used to the start input of the TDC 130. As will be described more thoroughly below, a direct digital synthesizer 132 provides an overflow output 134 based upon the input frequency word at input 122. This overflow is applied to the counter 128 to reset the counts. The output of the counter 128 is applied to the stop input of the TDC 130, whereupon the output 136 of the TDC 130 provides a measure of an indication of the actual signal generator jitter. The overflow 134 of the direct digital synthesizer 132 is also utilized as a reset to the reference signal counter 128. Because the frequency of the desired RF signal provided on output 124 is less than the reference signal on 120, and in the example 50 mHz as compared to 1 gHz, the counter 128 will be reset at about 20 NS intervals, ± the amount of time due to the system jitter. Accordingly, in a typical cycle, the counters 126 and 128 will provide a count output every 20 nanoseconds. The outputs of counters 126 and 128 is connected to respective multiplier circuits 136 and 138 The digital multipliers 136 and 138 also have corresponding second inputs to which a multiplier factor is applied for multiplying the counter inputs. Multiplier factors corresponding to digital words equivalent to, for example, one nanosecond, can be applied to each of the multipliers 136 and 138. In this manner, the output of multiplier 136 will comprise a digital word corresponding to a 10 nanosecond period while the output of multiplier 138 will provide a digital word corresponding to a 20 nanosecond period, the difference of which is an ideal or reference trip plan. The output of multiplier 136 is applied to a subtractive input of the adder 140 which, in the example, can be a difference circuit. The output of the adder 140 provides an indication of the difference in units of time. A multiplier 142 receives as inputs the output of the adder 140, as well as a digital frequency word ($2\pi f$), where f corresponds to the frequency of the digital input 122. The output of the multiplier 142 defines the ideal trip plan. The output 144 of the multiplier 142 defines the reference trip plan, such as that illustrated in FIG. 6, namely the trip plan data connected to the negative input of circuit 76.

The output of adder 160 (optional) is applied to one input of a multiplier 146, while the output of the TDC 130 is applied to the other input. The output of the multiplier 146 defines an actual or measured phase illustrating the actual jitter error in the system. The output 148 of the multiplier 146 corresponds to the output of the multiplier 74 shown in FIG. 6. A digital adder circuit 150 adds positive and negative inputs to provide a difference output. Particularly, the actual phase on conductor 148 is applied to the positive input of adder 150, while the reference phase on conductor 144 is applied to the negative input of adder 150. The output of adder 150 defines a difference phase ($\delta\psi$) connected to the input of a digital correction circuit 152. The digital correction circuit 152 determines the nature of the jitter in connection with the modulo of the system, similar to the wraparound phase described above in conjunction with the other embodiments of the invention.

A sliding mode controller 154 provides high speed conversion of the $\delta\psi$ to a corresponding frequency change ($\delta f$). The digital word applied to the signal generator input 122 is applied to an adder 156, as is the change in frequency generated by the controller 154. The output of the adder 156 is applied as a digital word to the direct digital synthesizer 132 to provide a corresponding RF signal on output 124. Importantly, the $\delta f$ error signal provided by the controller 154 represents a change to the digital word on input 122 to offset or compensate for jitter or other nuances of the signal generator. It should also be realized that direct digital synthesizers 132 are available and of the type that provide an overflow output 134 at desired intervals for corresponding digital inputs, for example, every 20 nanoseconds for the 50 mHz digital input.

An additional adder 160 is optionally provided to produce scaling or other modification of the $2\delta f$ feedback, based upon the output of the controller 154. With respect to the controller 154, it is believed that a sophisticated, high speed controller, such as the sliding mode type, will be required in the signal generator application. It should also be understood that the reference signal applied to the input 120 may be analog or digital, and preferably a much higher frequency than that desired at the output 124. It should be further understood that the RF signal provided on the signal generator output 124 can be changed by changing the digital word on the input 122, without changing the reference signal on reference input 120 A signal generator operating in accordance with the foregoing is believed to provide a programmable RF output that has a significant reduction in jitter, and thus provides a highly stable and precision signal generator.

While the preferred and other embodiments of the invention have been disclosed with reference to specific phase slippage systems and methods, it is to be understood that many changes in detail may be made as a matter of engineering choices without departing from the spirit and scope of the invention, as defined by the appended claims.

What is claimed is:

1. A system for achieving synchronism between a first and second parameter where said second parameter changes with time, said system comprising:
    a generator for generating and controlling said second changing parameter;
    a detector for detecting a representation of said second changing parameter with a corresponding representation of said first parameter at sample times to produce an actual error therebetween;
    a trip-plan generator for use in achieving said synchronism, said trip-plan generator providing a reference error at each said sample time;
    a comparator for comparing the actual error with the reference error; and means responsive to an output of the comparator for controlling the generator for producing a corrected said second parameter.

2. The system of claim 1, further including means for driving said system at periodic sample times.

3. The system of claim 1, wherein said first and second parameter comprise electrical signals, and said generator comprises a frequency generator.

4. The system of claim 3, further including means for synchronizing the frequency and phase of said parameters.

5. The system of claim 1, wherein said trip-plan generator provides an initial offset between said first and second parameters.

6. The system of claim 1, wherein said trip-plan generator comprises a processor having trip-plan data prestored for use at said sample times.

7. The system of claim 1, wherein said trip-plan generator provides real-time reference delays on the fly.

8. The system of claim 1, in combination with a pair of particle accelerators for timing each said accelerator so that particle bunches can be transferred from one accelerator to the other.

9. The system of claim 1, wherein said trip-plan generator and said comparator comprise a digital signal processor.

10. In a system having a first subsystem operating in a frequency range between a first frequency and a second frequency, and a second subsystem operating at said second frequency, a system for synchronizing the two subsystems at said second frequency, comprising:
a phase detector for detecting a phase between representations of the second operating frequency of said second system and representations of the operating frequency of said first subsystem;
a database for storing desired reference phase data between said first operating frequency and said second operating frequency;
means for comparing the phase detected by said phase detector with the stored desired reference phase and for generating an error signal;
means for converting said error signal to a change in a control parameter of one of said subsystems; and
means for modulating a parameter of at least one of said subsystems with said control parameter change to control the respective operating frequency thereof.

11. The system of claim 10, further including a processor for calculating said reference phase data for storing in said database.

12. The system of claim 11, wherein said processor is programmed to calculate said reference phase data in advance of controlling said first subsystem.

13. The system of claim 10, further including a time-to-digital converter for comparing said first subsystem operating frequency with said second subsystem operating frequency to define a time parameter representative of a phase difference therebetween.

14. The system of claim 13, further including means for converting said time parameter to a distance parameter, and wherein said reference phase data stored in said database is a measure of distance.

15. The system of claim 10, wherein said control parameter comprises a phase between two electrical signals.

16. The system of claim 10, wherein said control parameter comprises a frequency at which one of said subsystems must operate to reduce said error signal.

17. The system of claim 10, further including means for processing the error signal and providing a different error signal as a function of an operating modulo of the system.

18. A system for synchronizing a sweep frequency of a first subsystem with a constant frequency of a second subsystem, comprising:
a first frequency generator responsive to input digital signals for generating different frequencies for driving said first subsystem;
a second frequency generator for generating a frequency for driving said second subsystem;
means for dividing a frequency of at least one of said first and second subsystems;
a detector for comparing said first and second subsystem frequencies and providing an output parameter defining a phase therebetween;
processor means for receiving said phase and comparing said phase with prestored trip plan data and providing an output control parameter;
said processor means providing digital signals to said first frequency generator for controlling said first frequency generator; and
a modulator for modulating said processor means digital signals with said output control parameter to provide a modulated digital output for controlling said first frequency generator.

19. The system of claim 18, wherein said modulator comprises a digital adder for adding two digital words.

20. The system of claim 18, wherein said phase comprises a time parameter, and wherein said processor means is programmed to convert said time parameter to a corresponding distance parameter, and wherein a trip plan data is prestored in a database of said processor means as a distance parameter.

21. The system of claim 18, wherein said processor means comprises a pair of processors, including a first processor which provides digital words representative of a sweep frequency according to a predefined criteria, and said second processor causes the digital words of said first processor to be added to the output control parameter defined by other digital words to achieve said modulation.

* * * * *